United States Patent [19]

Ninnis

[11] Patent Number: 5,227,781
[45] Date of Patent: Jul. 13, 1993

[54] MOSFET SWITCH MATRIX

[75] Inventor: Thomas J. Ninnis, San Francisco, Calif.

[73] Assignee: Litton Systems, Inc., Beverly Hills, Calif.

[21] Appl. No.: 663,094

[22] Filed: Mar. 1, 1991

[51] Int. Cl.[5] .............................................. H04B 1/00
[52] U.S. Cl. ............................ 340/825.91; 340/825.79
[58] Field of Search ........... 340/825.79, 825.8, 825.85, 340/825.89, 825.9, 825.91, 825.93, 825.94, 895.96; 307/239, 241, 248, 571

[56] References Cited

U.S. PATENT DOCUMENTS

| | | | |
|---|---|---|---|
| 3,713,104 | 1/1973 | Stich | 340/825.9 |
| 3,725,863 | 4/1973 | Freimanis | 340/825.9 |
| 3,973,253 | 8/1976 | Criscimagna et al. | 340/825.79 |

*Primary Examiner*—Donald J. Yusko
*Assistant Examiner*—Dervis Magistre
*Attorney, Agent, or Firm*—Poms, Smith, Lande & Rose

[57] ABSTRACT

A solid state switch matrix for developing a high current, high voltage output power pulse in response to a small signal input pulse includes a plurality of solid state switch modules and a controller. Each of the modules has a small signal input, a large signal input and an output. The modules are arranged in rows and in columns such that modules in each of the rows are connected in parallel and modules in each of the columns are connected in series. The controller has an input to which the input pulse is applied and develops a switching pulse for application to the small signal input of each of the modules in response to the input pulse. Each of the modules becomes conductive between its large signal input and its output in response to said switching pulse. When each module is conductive, the matrix is conductive between the large signal input of each of the modules connected in parallel in a first row and the output of each of the modules connected in parallel in a last row to develop the output power pulse.

35 Claims, 3 Drawing Sheets

MOSFET SWITCH MATRIX

FIELD OF THE INVENTION

The present invention relates generally to electrical switches, and more particularly to a solid state switch matrix wherein a plurality of switching modules are connected serially and parallel with each other.

BACKGROUND OF THE INVENTION

Several types of electronic systems require high voltage, high current pulses of electrical energy in order to operate. Usually, the pulses must have a very fast rise time and a high frequency rate of repetition. Typically, the pulses have a rise time of approximately 400 nanoseconds and a frequency of several kilohertz. To develop these output power pulses, a high power switch is required. In these types of electronic systems, the switch must be able to accommodate an output power pulse of several thousand volts and a couple hundred amperes.

Presently, such switches for these electronic systems are constructed using a thyratron tube. The thyratron tube acts as a switch between high power source and an output device. The rapid switching of the thyratron tube modulates the high power source to apply pulses of output power to the output device. The output pulse is usually inductively coupled to a load through the secondary winding of a transformer. In these systems, the switch and transformer are usually referred to as a "modulator."

In a particular type of electronic system, the load is typically a high power travelling wave tube. The output power pulses are applied to the high powered tube. The tube, as is well known, amplifies a low level microwave signal. The amplified high power microwave signal may then be radiated by an antenna.

The basic principle of operation of these modulators depends upon the storage of electrical energy in the primary winding of the transformer, and the subsequent discharge of a fraction or all of the stored energy through the secondary winding into the high powered vacuum tube. The type of modulator which discharges all of the stored energy during each pulse is referred to as a line type modulator which use pulse forming networks. Modulators which discharge only a small fraction of the stored energy are termed hard tube modulators, this term being taken from the use of the thyratron tube as the switch.

The main disadvantage of the line type modulator is that they operate at fixed pulse widths, and are limited in duty cycle and pulse repetition frequency. Additionally, their overall reliability is low due to the use of the thyratron, which exhibits a relatively short life.

Hard tube modulators are considerably more versatile with regards to pulse widths, duty cycle and pulse repetition frequency. However, their overall reliability is even worse than line type modulators due to the higher current, hence the higher stress, that the thyratron encounters.

The stress on the thyratron in the hard tube modulator is from the storage of electrical energy within the primary winding of the transformer. The primary winding is coupled in series with the switch and the power source. The switching of current in the primary winding develops considerable voltage and current stresses on the thyratron tube.

In the hard tube modulator, it would be highly desirable to eliminate the use of the thyratron and replace it with solid state switch which would take advantage of the high reliability and long life of solid state electronics as compared to thyratron tubes. However, a solid state device cannot by itself handle the current and voltage requirements of the hard tube modulator switch.

SUMMARY OF THE INVENTION

It is an object of the present invention to overcome one or more of the disadvantages and limitations of the prior art enumerated hereinabove. It is a further object of the present invention to provide a novel solid state switch matrix wherein the matrix is formed from a plurality of switch modules coupled in series and in parallel with each other to distribute the current and voltage of the matrix switch substantially across each module. It is a further object of the present invention to provide a novel construction for each switch module.

According to the present invention, a solid state switch matrix for developing a high current, high voltage output power pulse in response to a small signal input pulse includes a plurality of solid state switch modules and a controller. Each of the modules has a small signal input, a large signal input and an output. The modules are arranged in rows and in columns such that modules in each of the rows are connected in parallel and modules in each of the columns are connected in series. The controller has an input to which the input pulse is applied and develops a switching pulse for application to the small signal input of each of the modules in response to the input pulse. Each of the modules becomes conductive between its large signal input and its output in response to the switching pulse. When each module is conductive, the matrix is conductive between the large signal input of each of the modules connected in parallel in a first row and the output of each of the modules connected in parallel in a last row to develop the output power pulse.

It is an important feature of the present invention that the modules are electrically balanced such that a voltage across the matrix is when the matrix is nonconductive substantially equally distributed across serially coupled modules and a current through the matrix when the matrix is conductive is substantially equally distributed through parallel coupled modules.

In one aspect of the present invention each module may be constructed from a MOSFET switch which is turned on, or becomes conductive, when the switching pulse is applied to its gate. A Zener diode and a resistor are each coupled between the source and drain of the MOSFET switch with the Zener diode and resistor parallel to each other. When the MOSFET switch is turned off, the resistor acts to equally divide the total matrix voltage among the serially coupled modules. During the short period of time when the MOSFET switch transitions from on to off, there will be unequal voltages across serially coupled modules because of unequal output capacitance between modules. If this voltage transient should begin to approach a level potentially damaging to the MOSFET, the Zener diode enters into its reverse bias breakdown mode, clamping the MOSFET drain to source voltage at a safe level. Equal current sharing among parallel coupled modules is accomplished by operating the MOSFET switch in each module in its saturated mode when on. The resistance of a MOSFET switch (in a saturated mode) increases with increasing current or temperature. Thus, when a MOSFET switch has a lower resistance than other parallel coupled MOSFET switches, it will begin to conduct proportionally more current. However, the higher current through the MOSFET results in an increased resistance, with the extra power dissipation due to the larger current further increasing the resistance of the MOSFET. The result of this self-regulating action is that parallel coupled modules equally distribute the current.

These and other advantages and features of the present invention will become readily apparent to those skilled in the art from a study of the following Description of an Exemplary Preferred Embodiment when read in conjunction with the attached Drawings and appended Claims.

DESCRIPTION OF AN EXEMPLARY PREFERRED EMBODIMENT

Figure 1:
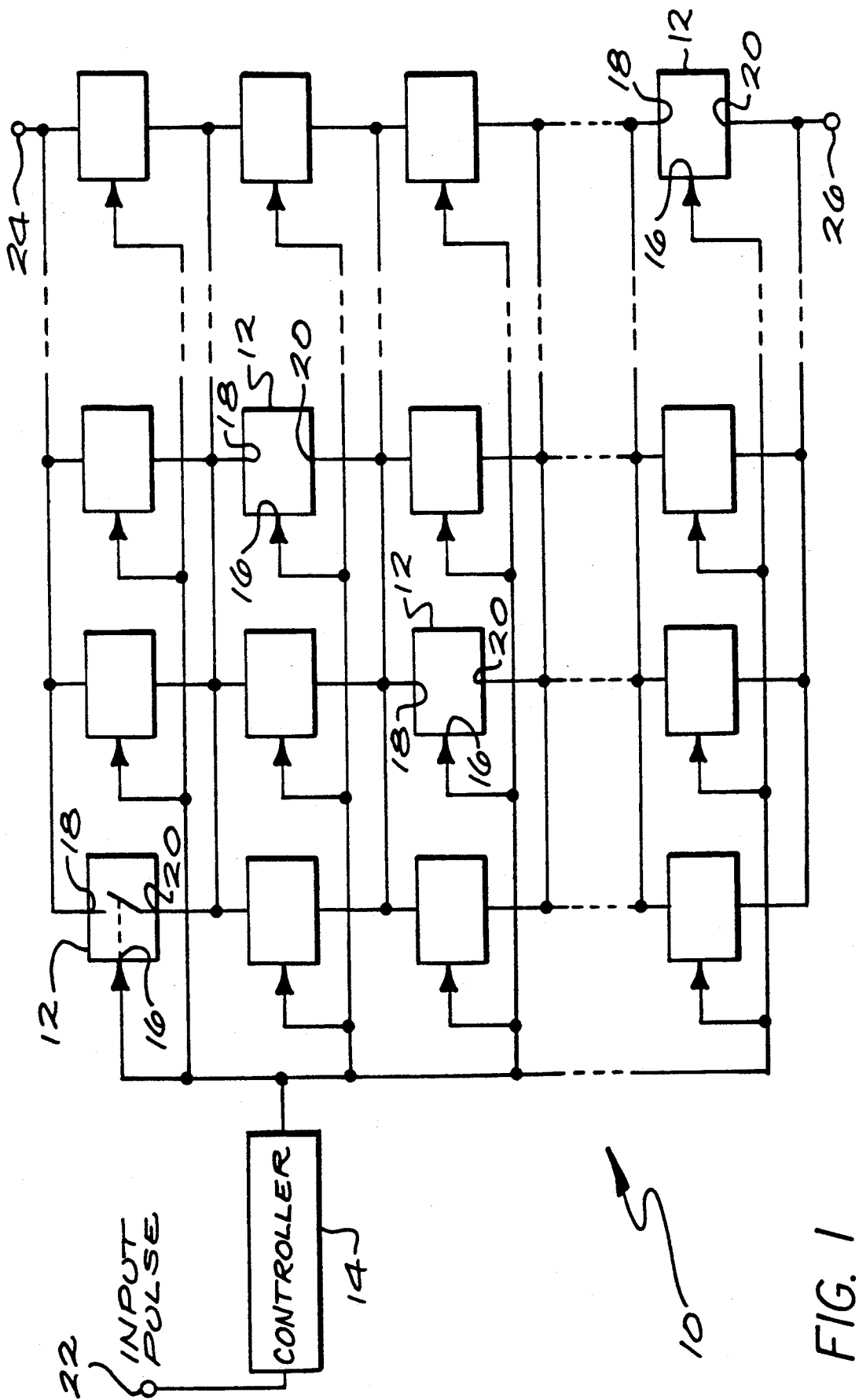
FIG. 1 is a schematic block diagram of a MOSFET switch matrix constructed according to the principles of the present invention.

Referring now to FIG. 1, there is shown a switch matrix 10 constructed according to the principles of the present invention. As will be described in greater detail in conjunction with FIG. 4 hereinbelow, the switch matrix 10 is useful for developing a high current, high voltage power output power pulse in response to a small signal input pulse. The switch matrix 10 includes a plurality of solid state switch modules 12 and a controller 14.

Each of the switch modules 12 has a small signal input 16, a large signal input 18, and an output 20. As best seen in FIG. 1, each of the modules 12 are arranged in rows and in columns. The modules 12 in each of the rows are connected in parallel. Furthermore, the modules 12 in each of the columns are connected in series.

The controller 14 has an input 22 to which the small signal input pulse is applied. In response to the input pulse, the controller 14 develops a switching pulse for application to the small signal input 16 of each of the switch modules 12. When the switching pulse is applied to each small signal input 16 of the switch modules 12, the modules 12 become conductive between their large signal input 18 and their output 19. When each of the modules 12 is conductive, the switch matrix 10 is conductive between its input terminal 24 and its output terminal 26. The input terminal 24 of the matrix 10 is connected in parallel with each large signal input 18 of the modules 12 in a first row of the matrix 10. The output terminal 26 is connected in parallel to the large signal output 20 to the modules 12 in the last row of the matrix 10.

When the matrix 10 is connected in series to a power source and an output device, as will be hereinbelow described in greater detail, the matrix 10 will cause the energy of the power source to be delivered to the output device each time an input pulse is applied to the controller input 22. A resultant current is then developed in the matrix 10 between its input terminal 24 and output terminal 26. Each of the modules 12 is electrically balanced such that this current through the matrix 10 is substantially equally distributed through parallel coupled ones of the modules 12.

When the matrix 10 is nonconductive, there is no current through the matrix 10 or the output device. Accordingly, the total power source voltage appears across the matrix 10, and specifically, across its input 24 and output 26. The electrical balancing of the modules 12 further divides this voltage equally among serially coupled ones of the modules 12.

Figures 2, 3:
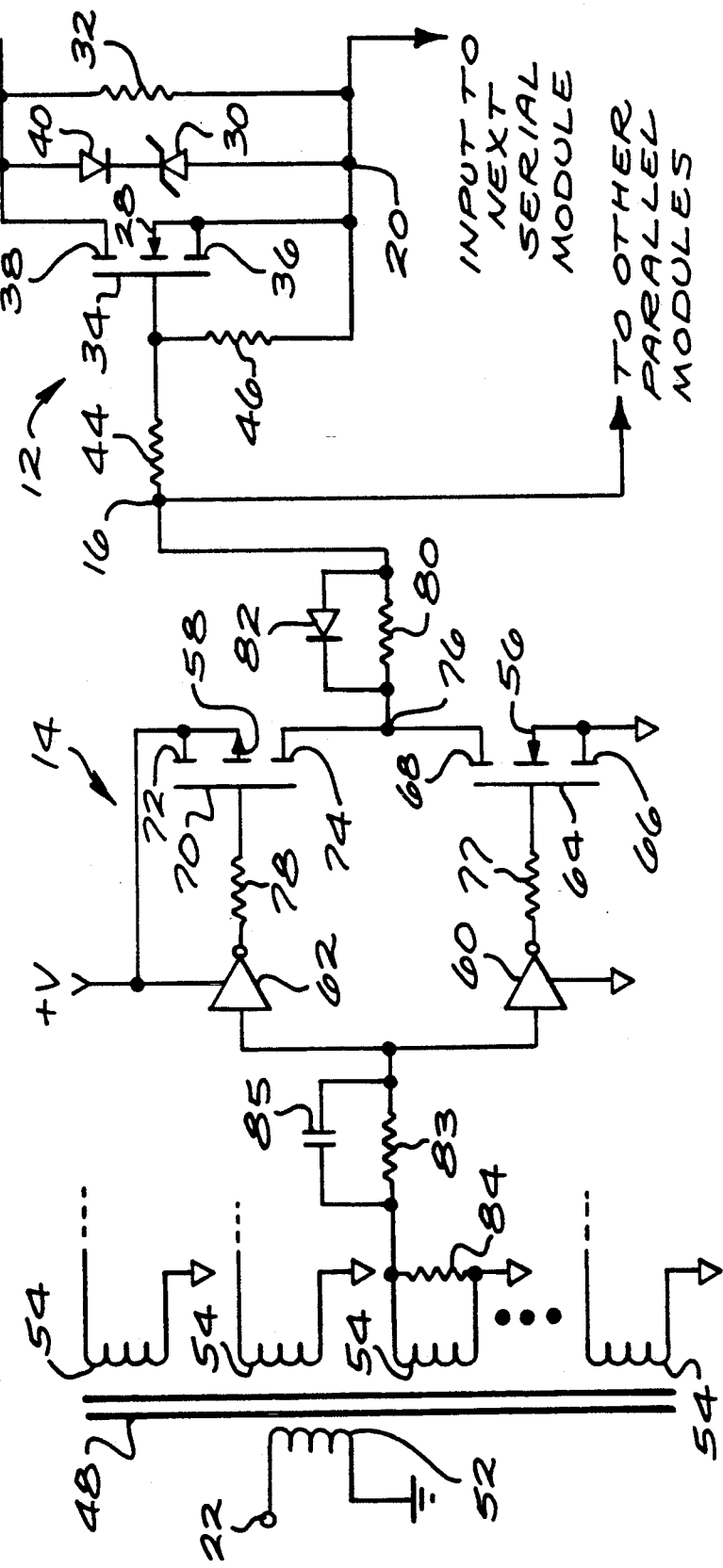
FIG. 2 is a simplified schematic of each switch module of FIG. 1.
FIG. 3 is a more detailed schematic showing a portion of the controller and more detail of the switch module.

With further reference to FIG. 2, there is shown a simplified schematic of each switch module 12. In its basic configuration, the switch module 12 includes an n-channel MOSFET switch 28, a Zener diode 30 and a resistor 32.

The MOSFET switch 28 includes a gate 34, a source 36 and a drain 38. The first Zener diode 30 has its anode coupled to the source 36 of the MOSFET switch 28 and its cathode coupled to the drain 38 of the MOSFET switch 28. The resistor 32 is coupled in parallel with the Zener diode 30. The gate 34, the source 36 and the drain 38 of the MOSFET switch 28 are coupled to the respective gate, source and drain of each other MOSFET switch in parallel coupled modules in a common row. For serial connection, the source 36 of the MOSFET switch 28 is coupled to the drain of the module 12 in a lower row of the matrix 10. Similarly, the drain 38 of the MOSFET switch 28 is coupled to the source of the MOSFET switch of the module 12 in an upper row of the matrix 10. As will be described in greater detail hereinbelow, the controller 14 develops simultaneously a switching pulse for application to the small signal input 16 of the modules 12 in each row, and in particular the gate 34 of the MOSFET switch 28.

With each MOSFET switch 28 off, the resistor 32, being identical in each module 12, divides the total "open circuit" voltage between the matrix input 24 and matrix output 26 equally among serially coupled ones of the modules 12. When a positive potential switching pulse is applied the gate 34 of the MOSFET switch 28, the MOSFET switch 28 is turned on. With each module 12 in the matrix 10 being simultaneously turned on, the voltage between the matrix input 24 and the matrix output 26 goes to substantially zero causing a voltage to be developed across the output device and a current to be developed through each module 12.

It is a feature of the present invention that the current through each module 12 be substantially equal when the MOSFET switch 28 is on. Equal current sharing among parallel coupled modules 12 is accomplished by operating the MOSFET switch 28 in each module 12 in its saturated mode when on. The resistance of the MOSFET switch 28 (in a saturated mode) increases with increasing current or temperature. Thus, when one MOSFET switch 28 has a lower resistance than one of the other parallel coupled MOSFET switches 28, it will begin to conduct proportionally more current. However, the higher current through the one MOSFET switch 28 results in an increased resistance, with the extra power dissipation due to the larger current further increasing the resistance of this particular MOSFET switch 28. The result of this self-regulating action is that parallel coupled modules 12 equally distribute the current. During the transition of the MOSFET switch 28 to its off state, there will be unequal voltages across serially coupled modules 12 because of unequal output capacitance between modules 12. If this voltage transient should begin to approach a level potentially damaging to the MOSFET switch 28, the Zener diode 30 enters into its reverse bias breakdown mode, clamping the MOSFET drain to source voltage at a safe level.

Although the module 12 has been described as being constructed with a MOSFET switch 28, it is apparent that a bipolar or other type of field effect transistor may be used. Also, the polarity of the transistor used as the switch may also differ. All that is required is that when the switching pulse is applied to the small signal input 16 of the module 12, the transistor switch is turned on so that a voltage may be developed across the module 12 and a current enabled therethrough. The first Zener diode 30 may be connected to this transistor switch so that, when the switching transistor transitions from on to off, the Zener diode 30 will prevent excessive switch voltage by going into its reverse breakdown mode.

Referring now to FIG. 3, there is shown a detailed circuit diagram of the module 12, and a detailed circuit diagram of a portion of the controller 14. The module 12 may further include a second diode 40, a first gate resistor 44 and a second gate resistor 46.

The second diode 40 is coupled in series with the Zener diode 30. The second diode 40 has its anode coupled to the drain 38 of the MOSFET switch 28 and its cathode coupled to the Zener diode 30. The resistor 32 is coupled in parallel with the series combination of the second diode 40 and the Zener diode 30.

In general, the second diode 40 is biased to reduce the effective reverse bias capacitance of the Zener diode 30. It is well known that the Zener diode a relatively large junction capacitance. The second diode 40 places a relatively small junction capacitance in series with the junction capacitance of the Zener diode 30. Therefore, the junction capacitance of the second diode 40 approximate the total diode capacitance between the source 36 and drain 38 of the MOSFET switch 28.

The first gate resistor 44 is coupled in series between the input 16 of the switch module 12 and the gate 34 of the MOSFET switch 28. The second gate resistor 46 is coupled between the gate 34 of the MOSFET 28 and its source 36. The first gate resistor 44 and second gate resistor 46 are antioscillation resistors. If the source impedance is too low, the first gate resistor 44 will prevent self oscillation. Similarly, the second gate resistor 46 also prevents oscillation.

The controller 14 includes a transformer 48 and a plurality of amplifier drivers 50. In FIG. 3, one such amplifier driver is shown. As will become apparent from the following description, there is one amplifier driver 50 for each row of switch modules 12 within the matrix 10.

The transformer 48 has a primary winding 52 and a plurality of secondary windings 54. There is one secondary winding 54 for each row of switch modules 12. Each of the amplifier drivers 40 is interconnected in series between a respective secondary winding 54 and the small signal input 16 of the modules 12 in a respective one of the rows of modules 12.

The primary winding 52 forms the input 22 of the controller 14. When the input pulse is applied to the primary winding 52, it is inductively coupled to each of the secondary winding 54, as is well known. In response to the input pulse being coupled to the secondary windings 54, the amplifier driver 50 connected to each secondary winding 54 develops the switching pulse for its respective row.

Each driver amplifier 50 includes a n-channel MOSFET 56, a p-channel MOSFET 58, a first invertor 60 and a second invertor 62.

The n-channel MOSFET 56 has a gate 64, a source 66 and a drain 68. The p-channel MOSFET 58 has a gate 70, a source 72 and a drain 74. The drain 68 of the n-channel MOSFET 56 and the drain 74 of the p-channel MOSFET 58 are commonly connected to a node 76. The source 66 of the n-channel MOSFET 56 is coupled to a reference potential and the source 72 of the p-channel MOSFET 58 is coupled to a positive bias potential. The reference potential is the potential at the source 36 of each of the MOSFET switches 28 coupled to the matrix output 26.

The first invertor 60 is coupled in series between the secondary winding 54 and the gate 64 of the n-channel MOSFET 56. Similarly, the second invertor 62 is coupled between the secondary winding 54 and the gate 70 of the p-channel MOSFET 58.

As is best seen in FIG. 3, the first invertor 60 is bias to the reference potential and the second invertor 62 is biased to the positive bias potential. Since these invertor are typically fabricated on the same chip, the output of the first invertor 60 and second invertor 62 will vary between the reference potential and the positive bias potential. Interconnected between the first invertor 60 and the gate 64 of the n-channel MOSFET 56 is a gate drive resistor 77. Similarly, connected between the output of the second invertor 62 and the gate 70 of the p-channel MOSFET 58 is the gate drive resistor 78.

In operation, the n-channel MOSFET 56 and the p-channel MOSFET 58 functioned as serially coupled totem pole biased transistor switches. In the totem pole biasing, the n-channel MOSFET 56 is on and the p-channel 58 is off to couple the reference potential to the node 76 in the absence of the input pulse. When the input pulse is applied to the input 22 of the controller 14, and is coupled through the secondary winding 54, the input of each of the first invertor 60 and second invertor 62 goes to a positive potential. The output of each of the first invertor 60 and second invertor 62 then goes to reference potential. The reference potential at the gate 64 of the n-channel MOSFET 56 turns off the MOSFET 56 whereas the reference potential at the gate 70 at the p-channel MOSFET 58 turns on the MOSFET 58. Therefore, in the presence of the input pulse, the n-channel MOSFET 56 is off and the p-channel MOSFET 58 is on to couple the positive bias potential to the node 76. The positive potential at the node 76 is then coupled to the input 16 of the switch module 12 as the switching pulse.

Of course, the amplifier driver 50 may use other polarities and other types of transistor switches. It is not necessary that the amplifier driver be of totem pole configuration. However, the totem pole configuration is provides rapid switching speeds as is well known.

When the switching pulse developed at node 76 is coupled to the input 16 of the switch module 12, to cause the MOSFET switch 28 to turn on, the power source becomes coupled to the output device to apply an output power pulse thereto. The rise time of this output power pulse is controlled by the current through the first gate resistor 44. The design considerations for the amplitude of this current are to achieve a fast rise time of the output power pulse with minimal overshoot of the output power pulse. To limit this current, the controller 14 further includes a resistor 80 coupled in series between the node 76 and the input 16 of the switch module 12. The resistor 80 has a resistance selected in accordance with a desired rise time of the output power pulse. Coupled in parallel with the resistor 80 is a diode 82 which is arranged to be reverse biased when the switching pulse is being developed at the node 76. When the switching pulse is removed, the diode 82 becomes forward bias thereby shorting out the resistor 80. By shorting out the resistor 80, the fall time of the output power pulse is minimized. Minimizing the fall time of the output power pulse minimizes power dissipation within the MOSFET switch 28 when the amplifier driver 50 is being turned off. The controller 14 may also include a drive resistor 83, shunt resistor 84 in parallel with each secondary winding 54, and a capacitor 85 parallel to resistor 83.

Figure 4:
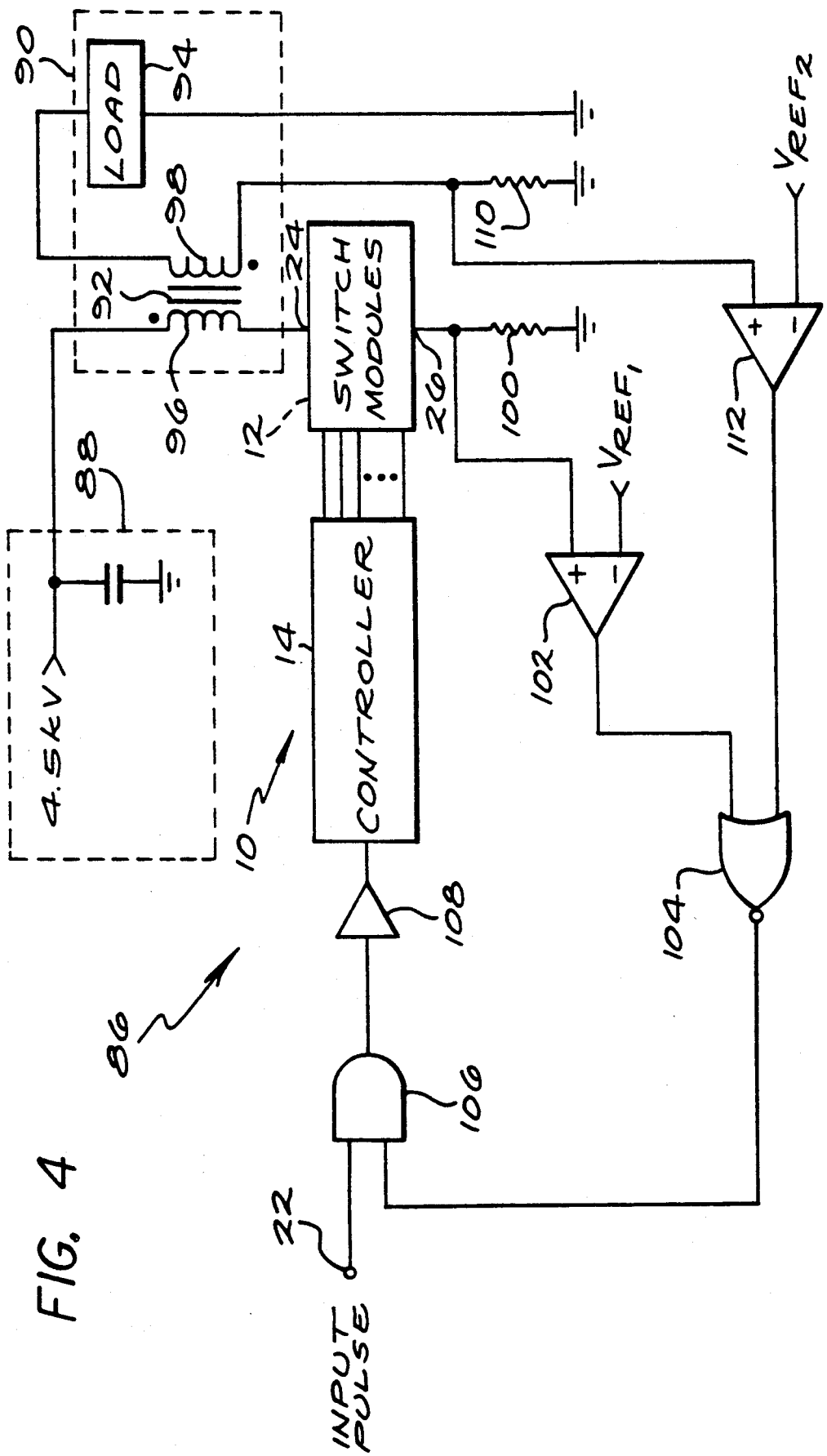
FIG. 4 is a schematic diagram showing a typical application of the switch matrix of FIG. 1.

With reference now to FIG. 4, there is shown a typical application of the switch matrix 10 described hereinabove as used in a high power output power switching system 86. The power switching system 86 includes a high power source 88, a solid state switch matrix 10 described hereinabove as having the switch modules 12 and controller 14, and an output device 90. The output device 90 is coupled in series with the power source 88 and the switch matrix 10. With the matrix 10 nonconductive, the voltage of the power source 88 will be equally divided across serially coupled ones of the modules 12 for reasons as set forth above.

When the input pulse is applied to the input 22 of the controller 14, the switching pulse is applied to each of the switch modules 12 as hereinabove described. Accordingly, the matrix 10 becomes conductive causing the power source 88 to couple a high output power pulse to the output device 90. As described hereinabove, each of the modules 12 will have a current therethrough which will be evenly distributed among parallel coupled modules 12.

The output device 90 may include a transformer 92 having a load 94. The transformer 92 has a primary winding 96 and a secondary winding 98. The primary winding 96 is coupled in series between the power source 88 and the input 24 of the switch matrix 10. The load 94 may be coupled in parallel with the secondary winding 98.

In practice, the load 94 may be any such load which requires a high power pulse, such as a travelling wave tube used for microwave amplification. In a typical application, the voltage developed across the switch matrix 10 when nonconductive may be in the range of 5000 volts.

A typical current through the switch matrix 10, in the example described hereinabove, may be on the order of a couple hundred amperes. To insure that this total current does not exceed a maximum, the controller 14 may further include a first current sensing resistor 100 in series between the output 26 of the matrix 10 and ground potential. The value of the current sensing resistor 100 is very small, typically in the order of $10^{-2}$ ohms, to develop a small voltage at the output 26. This voltage is applied to the non-inverting input of a comparator 102. The inverting input of the comparator 102 has a first reference potential $V_{ref1}$ applied thereto. When the voltage developed by the current sensing resistor 100 exceeds the reference potential, the output of the comparator 102 goes high. The output of the comparator 102 is then coupled through a NOR gate 104 to an AND gate 106. The other input of the AND gate 106 forms the input 22 for the controller 14.

Normally, the output of the NOR gate 104 is high allowing the input pulse applied to the input 22 to be passed through the AND gate 106 through an amplifier driver 108 to the primary winding 52 of the controller 14. However, as the voltage is developed by the current sensing resistor 100 exceeds the first reference potential, the positive input to the NOR gate 104 will cause its output to go low thereby causing the output of the AND gate 106 also to go low. Therefore, the input pulse applied to the input 22 is blocked by the AND gate 106 thereby rendering the switch matrix 10 nonconductive as long as the voltage developed at the current sensing resistor 100 is above the first reference potential.

Similarly, the load 94 may be similarly protected by a second current sensing resistor 110 in series with the secondary winding 98 and ground potential. Again, the resistance of the second current sensing resistor 110 is selected to develop a small voltage which is applied to the non-inverting input of a second comparator 112. When the voltage developed by the second current sensing resistor 110 exceeds a second reference potential $V_{ref2}$, the output of the comparator 112 goes high causing the output of the NOR gate 104 to go low thereby blocking the AND gate 106 from passing the input pulse applied to the input 22. Therefore, with the currents through either current sensing resistor 100, 110 becomes excessive, the input pulse is blocked thereby protecting both the switch matrix 10 and the load 94 from excessive current.

To complete the description of the above identified invention, for all devices described hereinabove, the following is a table giving its value or commercially available part number.

| Resistor 32 | 150 kΩ |
| --- | --- |
| Resistor 44 | 5 Ω |
| Resistor 46 | 680 Ω |
| Resistor 77 | 5 Ω |
| Resistor 78 | 5 Ω |
| Resistor 80 | 15 Ω |
| Resistor 84 | 100 Ω |
| Resistor 85 | 100 Ω |
| Resistor 100 | .04 Ω |
| Resistor 110 | .3 Ω |
| MOSFET 28 | IXTM11N100 |
| MOSFET 56 | 2N6782 |
| MOSFET 58 | 2N6845 |
| Capacitor 85 | .01 µf |
| Diode 30 | 4 × 1N 555B in series |
| Diode 40 | 1N 6512 |
| Diode 82 | 1N 5809 |
| INVERTORS 60, 62 | DS0026 |
| Bias potential | 15 v |
| $V_{ref1}$ | 7 v |
| $V_{ref2}$ | 7 v |

There has been described hereinabove a novel switch matrix 10 which may be useful to develop a high voltage, high current output power pulse from a high voltage source for application to an output device. Those skilled in the art may now make numerous uses of and departures from the above described Exemplary Preferred Embodiment without department from the inventive concepts disclosed herein. Accordingly, the present invention is to be defined solely by the scope of the following Claims.

I claim:

1. A switch matrix for coupling a high voltage, high current power source to an output device, said switch matrix comprising:

a module having a switch, said switch having a small signal input, a large signal input and an output, wherein said switch is turned on in response to an external switching pulse applied to said small signal input, said switch when on causing a voltage to be developed across said module and a current to be developed through said module; and a resistor coupled in parallel with said switch between said large signal input and said output of said switch;

said module being coupled in series and in parallel with other modules in said matrix such that when all of said switches are off said resistor in each module divides the total voltage across said matrix substantially equally across each serially coupled module, and such that when all of said switches are on said switch in each module divides the total current through said matrix substantially equally through each parallel coupled module.

2. A switch matrix as set forth in claim 1 wherein said switch further includes a FET having a gate, a source and a drain, said switching pulse being applied to said gate, and said resistor being coupled in parallel with said switch between said drain and said source.

3. A switch matrix as set forth in claim 2 wherein said FET is a n-channel device.

4. A switch matrix as set forth in claim 3 wherein said n-channel device is a MOSFET.

5. A switch matrix as set forth in claim 2 wherein said switch pulse turns on said FET at a positive gate potential.

6. A switch matrix as set forth in claim 1 further comprising a Zener diode having an anode and a cathode and being coupled in parallel with said resistor, wherein said anode of said Zener diode is coupled to said output of said switch and said cathode of said Zener diode is coupled to said large signal input, said Zener diode thereby being arranged to be in a reverse bias breakdown mode to clamp voltage transients developed across said switch to said Zener diode breakdown voltage when said switch is turned off.

7. A switch matrix as set forth in claim 6 further comprising a second diode having an anode and a cathode and being coupled in series with said Zener diode, wherein said anode of said second diode is coupled to said large signal input of said switch, said cathode of said second diode is coupled to said cathode of said Zener diode, and said anode of said Zener diode is coupled to said output of said switch, the second diode thereby being arranged to minimize the effective junction capacitance of said Zener diode.

8. A switch matrix as set forth in claim 2 further comprising a Zener diode having an anode and a cathode and being coupled between said drain and said source, wherein said anode of said Zener diode is coupled to said source and said cathode of said Zener diode is coupled to said drain, such that said Zener diode is in a reverse bias breakdown mode to clamp voltage transients developed across said switch to said Zener diode breakdown voltage when said switch is turned off.

9. A switch matrix as set forth in claim 8 further comprising a second diode having an anode and a cathode and being coupled in series with said Zener diode, wherein said anode of said second diode is coupled to said drain, said cathode of said second diode is coupled to said cathode of said Zener diode, and said anode of said Zener diode is coupled to said source, the second diode thereby being arranged to minimize the effective junction capacitance of said Zener diode.

10. A switch matrix as set forth in claim 2 further comprising:

a first gate resistor in series with said gate, said switching pulse being applied to said first gate resistor; and a second gate resistor coupled between said gate and said source.

11. A solid state switch matrix for developing a high current, high voltage output power pulse in response to a small signal input pulse, said switch matrix comprising:

a plurality of solid state switch modules, each of said modules having a small signal input, a large signal input and an output, said modules being arranged in rows and in columns such that modules in each of said rows are connected in parallel and modules in each of said columns are connected in series; and a controller having an input to which said input pulse is applied, said controller developing a switching pulse for application to said small signal input of each of said modules in response to said input pulse, each of said modules becoming conductive between said large signal input and said output in response to said switching pulse so that said matrix is conductive between said large signal input of each of said modules connected in parallel in a first one of said rows and said output of each of said modules connected in parallel in a last one of said rows to develop said output power pulse across said solid state switch matrix;

said switch modules being electrically balanced such that when all of said switch modules are off the total voltage across said matrix is substantially equally divided between each serially connected switch module, and such that when all of said switch modules are on the total current through said matrix is substantially equally divided between each parallel connected switch module.

12. A switch matrix as set forth in claim 11 wherein said controller includes multiple controller outputs, and further wherein said controller develops said switching pulse for application to said small signal input of said modules in a common row, said controller developing a separate switching pulse at east of said multiple controller outputs for each respective one of said rows.

13. A switch matrix as set forth in claim 11 wherein said controller includes:

a transformer having a primary winding and a plurality of secondary windings, each of said secondary winding being associated with a respective one of said rows, said input pulse being applied to said primary winding and coupled to each of said secondary windings; and a plurality of drivers, each of said drivers being interconnected between a respective one of said secondary windings and said small signal input of said modules in a respective one of said rows, each of said drivers developing said switching pulse for said respective one of said rows.

14. A switch matrix as set forth in claim 13 wherein each of said drivers includes:

a first switch having a signal input, a signal output, and a control input; and a second switch having a signal input, a signal output, and a control input, wherein said signal output of said first switch and said signal output of said second switch are interconnected at a common node, and further wherein said signal input of said first switch is coupled to a first potential and said signal input of said second switch is coupled to a second potential, such that said first switch is one and said second switch is off to couple said first potential to said common node between said first switch and said second switch in the absence of said input pulse and further such that said first switch is off and said second switch is on to couple said second potential to said common node in response to said input pulse, said switching pulse being developed at said common node.

15. A switch matrix as set forth in claim 14 wherein said first switch is an n-channel FET and said second switch is a p-channel FET, each FET having a gate, a source and a drain, said drain of each FET being coupled to said common node, said gate of each FET receiving said input pulse from one of said secondary windings, said source of said first FET being coupled to said first potential and said source of said second FET being coupled to said second potential.

16. A switch matrix as set forth in claim 15 wherein said driver further includes:
    a first invertor amplifier coupled between said one of said secondary windings and said gate of said first FET; and
    a second invertor amplifier coupled between said one of said secondary windings and said gate of said second FET.

17. A switch matrix as set forth in claim 16 wherein said first potential is ground potential and said second potential is a positive bias potential, said input pulse being a positive potential pulse.

18. A switch matrix as set forth in claim 13 wherein said controller further includes:
    a diode having an anode and cathode and being coupled in series between each one of said drivers and said small signal input of said modules in said respective one of said rows, wherein said anode of said diode is coupled to said small signal input and said cathode of said diode is coupled to said driver; and
    a resistor coupled in parallel with said diode, said resistor having a resistance selected in accordance with a rise time of said output power pulse, said diode becoming forward biased when said switching pulse is removed to minimize fall time of said output power pulse.

19. A switch matrix as set forth in claim 11 wherein each of said modules includes:
    a transistor switch which is turned on in response to said switching pulse applied at said small signal input, said switch when off having a voltage developed across said module and said switch when on having a current developed through said module, each of said voltage and current being between said large signal input and said module output; and
    a resistor coupled in parallel with said switch, said resistor distributing the voltage across said matrix substantially equally across each of said serially coupled modules when said transistor switch is off, and said transistor switch when on distributing the current through said matrix substantially equally through each of said parallel coupled modules.

20. A switch matrix as set forth in claim 19 wherein said transistor switch includes a FET having a gate, a source forming said output and a drain forming said large signal input, said switching pulse being applied to said gate, said resistor being coupled between said drain and said source.

21. A switch matrix as set forth in claim 20 wherein said FET is a n-channel device.

22. A switch matrix as set forth in claim 21 wherein said n-channel device is a MOSFET.

23. A switch matrix as set forth in claim 20 wherein said switching pulse turns on said FET at a positive gate potential.

24. A switch matrix as set forth in claim 19 further comprising a Zener diode having an anode and a cathode and being coupled in parallel with said resistor, wherein said anode of said Zener diode is coupled to said module output and said cathode of said Zener diode is coupled to said large signal input, said Zener diode thereby being arranged to be in a reverse bias breakdown mode to clamp voltage transients developed across said switch to said Zener diode breakdown voltage when said switch is turned off.

25. A switch matrix as set forth in claim 24 further comprising a second diode having an anode and a cathode and being coupled in series with said Zener diode, wherein said anode of said second diode is coupled to said large signal input of said switch, said cathode of said second diode is coupled to said cathode of said Zener diode, and said anode of said Zener diode is coupled to said module output, the second diode thereby being arranged to minimize the effective junction capacitance of said Zener diode.

26. A switch matrix as set forth in claim 20 further comprising a Zener diode having an anode and a cathode and being coupled between said drain and said source, wherein said anode of said Zener diode is coupled to said source and said cathode of said Zener diode is coupled to said drain, such that said Zener diode is in a reverse bias breakdown mode to clamp voltage transients developed across said switch to said Zener diode breakdown voltage when said switch is turned off.

27. A switch matrix as set forth in claim 26 further comprising a second diode having an anode and a cathode and being coupled in series with said Zener diode, wherein said anode of said second diode is coupled to said drain, said cathode of said second diode is coupled to said cathode of said Zener diode, and said anode of said Zener diode is coupled to said source, the second diode thereby being arranged to minimize the effective junction capacitance of said Zener diode.

28. A switch matrix as set forth in claim 20 further comprising:
    a first gate resistor in series with said gate, said switching pulse being applied to said gate resistor; and
    a second gate resistor coupled between said gate and said source.

29. A high output power switching system comprising:
    a high power source;
    a solid state switch matrix including a plurality of switch modules and a controller, each of said modules having a small signal input, a large signal input and an output, said modules being arranged in rows and columns such that modules in each of said rows are connected in parallel and modules in each of said columns are connected in series, said controller having an input to which a small signal input pulse is applied and a plurality of controller outputs, said controller developing a switching pulse at each of said controller outputs in response to said input pulse, each of said plurality of controller outputs being associated with the respective one of said rows such that said switching pulse at each of said controller outputs is applied to said small signal input of said modules in said respective one of said rows, each of said modules becoming conductive between said large signal input and said module output in response to said switching pulse so that said matrix is conductive between said large signal input of each of said modules connected in parallel in a first one of said rows and said module output of each of said modules connected in parallel in a last one of said rows; and an output device coupled in series with said high power source and said matrix, said matrix in response to said switching pulse applied to each of said modules thereof becoming conductive causing said high power source to couple a high output power pulse to said output device, said modules being electrically balanced such that a voltage across said matrix when nonconductive is substantially equally distributed across serially coupled modules and a current through said matrix when conductive is substantially equally distributed through parallel coupled modules.

30. A system as set forth in claim 29 wherein each of said modules includes:
 a MOSFET having a gate, a source and a drain, said gate being in electrical communication with said small signal input, said drain forming said large signal input, said source forming said output; and
 a resistor coupled between said source and said drain, said resistor in each of said modules developing substantially the same voltage across each of serially coupled modules when said MOSFET is off.

31. A system as set forth in claim 30 wherein each of said modules further includes a Zener diode having an anode and a cathode and being coupled between said drain and said source of said MOSFET, wherein said anode of said Zener diode is coupled to said source and said cathode of said Zener diode is coupled to said drain, such that said Zener diode is in a reverse bias breakdown mode to clamp voltage transients developed across said switch to said Zener diode breakdown voltage when said switch is turned off.

32. A system as set forth in claim 31 wherein each of said modules further includes a second diode having an anode and a cathode and being coupled in series with said Zener diode, wherein said anode of said second diode is coupled to said drain, said cathode of said second diode is coupled to said cathode of said Zener diode, and said anode of said Zener diode is coupled to said source, the second diode thereby being arranged to minimize the effective junction capacitance of said Zener diode.

33. A system as set forth in claim 29 wherein said controller includes:
 a first current sensing resistor in series with said matrix switch wherein said current through said switch develops a second voltage across said sensing resistor;
 a comparator to which each of a first reference voltage and said second voltage are applied, said comparator developing a third voltage when said second voltage exceeds said first reference voltage; and
 a first gate to which each of said input pulse and said third voltage are applied, said gate passing said input pulse to said input of said controller in the absence of said third voltage and blocking said input pulse from application to said input of said controller in the presence of said third voltage thereby preventing excessive current through said matrix.

34. A system as set forth in claim 33 wherein said output device includes:
 a transformer having a primary winding and a secondary winding, said primary winding being coupled in series with said switch matrix; and
 a load, said load being coupled in parallel with said secondary winding.

35. A system as set forth in claim 34 wherein said controller further includes:
 a second current sensing resistor in series with said secondary winding wherein a current through said secondary winding develops a fourth voltage across said second resistor;
 a second comparator to which each of a second reference voltage and said fourth voltage are applied, said second comparator developing a fifth voltage when said fourth voltage exceeds said second reference voltage; and
 an OR gate to which each of said third voltage and said fifth voltage are applied, said OR gate being coupled to said first gate such that said first gate passes said input pulse in the absence of both of said third voltage and said fifth voltage and blocks said input pulse in the presence of either of said third voltage and said fifth voltage, thereby further preventing excessive current through said secondary winding.

* * * * *